(12) United States Patent
Pau et al.

(10) Patent No.: US 10,505,059 B2
(45) Date of Patent: Dec. 10, 2019

(54) MICRO-SCALE CONCENTRATED PHOTOVOLTAIC MODULE

(71) Applicant: THE ARIZONA BOARD OF REGENTS ON BEHALF OF THE UNIVERSITY OF ARIZONA, Tucson, AZ (US)

(72) Inventors: Stanley K Pau, Tucson, AZ (US); Linan Jiang, Tucson, AZ (US); Richard J Koshel, Tucson, AZ (US)

(73) Assignee: THE ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

(21) Appl. No.: 15/543,625

(22) PCT Filed: Jan. 15, 2016

(86) PCT No.: PCT/US2016/013670
§ 371 (c)(1),
(2) Date: Jul. 14, 2017

(87) PCT Pub. No.: WO2016/115502
PCT Pub. Date: Jul. 21, 2016

(65) Prior Publication Data
US 2018/0006176 A1  Jan. 4, 2018

Related U.S. Application Data

(60) Provisional application No. 62/104,455, filed on Jan. 16, 2015.

(51) Int. Cl.
*H01L 31/0475* (2014.01)
*H01L 31/054* (2014.01)
(Continued)

(52) U.S. Cl.
CPC ...... *H01L 31/0475* (2014.12); *G02B 19/0014* (2013.01); *G02B 19/0042* (2013.01);
(Continued)

(58) Field of Classification Search
CPC ............. H01L 31/0475; H01L 31/0725; H01L 31/0504; H01L 31/074; H01L 31/043;
(Continued)

(56) References Cited

U.S. PATENT DOCUMENTS

| 608,755 A | 8/1898 | Cottle |
|---|---|---|
| 642,196 A | 1/1900 | Belcher |

(Continued)

FOREIGN PATENT DOCUMENTS

| AU | 2009246638 | 11/2009 |
|---|---|---|
| CA | 2722714 | 7/2014 |

(Continued)

OTHER PUBLICATIONS

Faiman, David, "The path to ultra-high efficient photovoltaics", JRC Ispra, Italy Oct. 3-4, 2002.*

(Continued)

*Primary Examiner* — Golam Mowla
(74) *Attorney, Agent, or Firm* — Snell & Wilmer L.L.P.

(57) ABSTRACT

A photovoltaic ("PV") module may comprise an array of freeform micro-optics and an array of PV cells. The PV module may be a flat panel with a nominal thickness smaller than the length and width of the flat panel. An array of lenses may be embedded in an array substrate. The lenses may be coupled to light pipes. The lenses may concentrate light through the light pipes to multi-junction cells. Diffuse light may be transferred through the array substrate to a silicon cell. The lenses and light pipes may be manufactured using a molding and drawing process.

7 Claims, 17 Drawing Sheets

(51) Int. Cl.
  *G02B 19/00* (2006.01)
  *H01L 31/05* (2014.01)
  *H01L 31/0725* (2012.01)
  *H01L 31/074* (2012.01)
  *H01L 31/043* (2014.01)

(52) U.S. Cl.
  CPC ..... *G02B 19/0047* (2013.01); *G02B 19/0076* (2013.01); *H01L 31/043* (2014.12); *H01L 31/0504* (2013.01); *H01L 31/0543* (2014.12); *H01L 31/0547* (2014.12); *H01L 31/074* (2013.01); *H01L 31/0725* (2013.01); *Y02E 10/52* (2013.01)

(58) Field of Classification Search
  CPC ............ H01L 31/0547; H01L 31/0543; G02B 19/0076; G02B 19/0014; G02B 19/0047; G02B 19/0042
  See application file for complete search history.

(56) References Cited

U.S. PATENT DOCUMENTS

| | | |
|---|---|---|
| 670,917 A | 3/1901 | Eneas |
| 811,274 A | 1/1906 | Carter |
| 2,661,672 A | 12/1953 | Fairbanks |
| 2,827,690 A | 3/1958 | Brown |
| 2,904,612 A | 9/1959 | Regnier |
| 3,427,200 A | 2/1969 | Ernest et al. |
| 3,552,941 A | 1/1971 | Giffen |
| 3,586,492 A | 6/1971 | McMaster |
| 3,756,797 A | 9/1973 | Akeyoshi |
| 3,977,773 A | 8/1976 | Hubbard |
| 4,088,470 A | 5/1978 | Bourg et al. |
| 4,105,429 A | 8/1978 | Delgado |
| 4,107,521 A | 8/1978 | Winters |
| 4,154,219 A | 5/1979 | Gupta et al. |
| 4,180,414 A | 12/1979 | Diamond et al. |
| 4,245,895 A | 1/1981 | Wildenrotter |
| 4,313,746 A | 2/1982 | Juras |
| 4,354,193 A | 10/1982 | Werner |
| 4,404,565 A | 9/1983 | Gurney et al. |
| 4,436,373 A | 3/1984 | Kirsch |
| 4,461,278 A | 7/1984 | Mori |
| 4,473,065 A | 9/1984 | Bates |
| 4,525,196 A | 6/1985 | Fecik et al. |
| 4,535,961 A | 8/1985 | Sobeczak |
| 4,547,650 A | 10/1985 | Arditty |
| 4,568,156 A | 2/1986 | Dane |
| 4,575,207 A | 3/1986 | August |
| 4,616,909 A | 10/1986 | Dane |
| 4,678,292 A | 7/1987 | Miyatani et al. |
| 4,805,006 A | 2/1989 | Yamagushi et al. |
| 4,830,678 A | 5/1989 | Todorof et al. |
| 4,999,059 A | 3/1991 | Bagno |
| 5,118,543 A | 6/1992 | McColl |
| 5,129,934 A | 7/1992 | Koss |
| 5,143,535 A | 9/1992 | Herrington |
| 5,147,437 A | 9/1992 | Bristol |
| 5,169,456 A | 12/1992 | Johnson |
| 5,281,249 A | 1/1994 | Hampton et al. |
| 5,363,116 A | 11/1994 | Allen |
| 5,460,659 A | 10/1995 | Krut |
| 5,593,901 A | 1/1997 | Oswald et al. |
| 5,697,999 A | 12/1997 | Reunamaki |
| 5,787,878 A | 8/1998 | Ratliff |
| 6,034,319 A | 3/2000 | Falbel |
| 6,091,017 A | 7/2000 | Stern |
| 6,123,067 A | 9/2000 | Warrick |
| 6,257,022 B1 | 7/2001 | Caplan et al. |
| 6,301,932 B1 | 10/2001 | Allen et al. |
| 6,375,135 B1 | 4/2002 | Eason et al. |
| 6,378,339 B1 | 4/2002 | Zalesak et al. |
| 6,498,290 B1 | 12/2002 | Lawheed |
| 6,541,694 B2 | 4/2003 | Winston |
| 6,563,040 B2 | 5/2003 | Hayden et al. |
| 6,566,635 B1 | 5/2003 | Matsen et al. |
| 6,629,436 B1 | 10/2003 | Skeen |
| 6,739,729 B1 | 5/2004 | Blackmon et al. |
| 6,848,442 B2 | 2/2005 | Haber |
| 6,895,145 B2 | 5/2005 | Ho |
| 7,076,965 B2 | 7/2006 | Lasich |
| 7,258,320 B2 | 8/2007 | Tai |
| 7,297,865 B2 | 11/2007 | Terao et al. |
| 7,380,549 B1 | 6/2008 | Ratliff |
| 7,503,189 B2 | 3/2009 | Fukuyama et al. |
| 7,506,847 B2 | 3/2009 | Bailey |
| 8,082,755 B2 | 12/2011 | Angel |
| 8,319,697 B2 | 11/2012 | Conrad |
| 8,350,145 B2 | 1/2013 | Angel |
| 8,430,090 B2 | 4/2013 | Angel |
| 8,505,867 B2 | 8/2013 | Conrad |
| 8,604,333 B2 | 12/2013 | Angel |
| 8,662,072 B2 | 3/2014 | Butler |
| 9,318,635 B2 | 4/2016 | Luo |
| 2001/0036024 A1 | 11/2001 | Wood |
| 2003/0005954 A1 | 1/2003 | Emoto et al. |
| 2003/0070705 A1 | 4/2003 | Hayden et al. |
| 2004/0107731 A1 | 6/2004 | Doehring et al. |
| 2005/0051205 A1 | 3/2005 | Mook et al. |
| 2005/0081909 A1 | 4/2005 | Paull |
| 2005/0166957 A1 | 8/2005 | Imoto et al. |
| 2006/0054162 A1 | 3/2006 | Romeo |
| 2006/0057847 A1 | 3/2006 | Yanagawa et al. |
| 2006/0231133 A1 | 10/2006 | Fork |
| 2006/0243319 A1 | 11/2006 | Kusek et al. |
| 2007/0012934 A1 | 1/2007 | Abu-Ageel |
| 2007/0089774 A1 | 4/2007 | Lasich |
| 2007/0089778 A1 | 4/2007 | Horne et al. |
| 2007/0095341 A1 | 5/2007 | Kaneff |
| 2007/0256726 A1 | 11/2007 | Fork et al. |
| 2007/0272666 A1 | 11/2007 | O'Brien |
| 2008/0000516 A1 | 1/2008 | Shifman |
| 2008/0047605 A1 | 2/2008 | Benitez et al. |
| 2008/0053513 A1 | 3/2008 | Palmer |
| 2008/0092877 A1 | 4/2008 | Monsebroten |
| 2008/0185034 A1 | 8/2008 | Corio |
| 2009/0032102 A1 | 2/2009 | Chen et al. |
| 2009/0056790 A1 | 3/2009 | Tian |
| 2009/0126778 A1 | 5/2009 | Brounne et al. |
| 2009/0277224 A1 | 11/2009 | Angel et al. |
| 2009/0277498 A1 | 11/2009 | Angel |
| 2010/0037937 A1 | 2/2010 | Sater |
| 2010/0095999 A1 | 4/2010 | Menon |
| 2010/0126556 A1 | 5/2010 | Benitez et al. |
| 2010/0139645 A1 | 6/2010 | Whipple |
| 2012/0174966 A1 | 7/2012 | Snipes |
| 2012/0192919 A1 | 8/2012 | Mizuyama |
| 2012/0229911 A1 | 9/2012 | Rodriguez-Parada et al. |
| 2012/0260908 A1 | 10/2012 | Orsello |
| 2012/0312349 A1 | 12/2012 | Farberov |
| 2012/0316017 A1 | 12/2012 | Chiel |
| 2012/0318324 A1 | 12/2012 | Ning et al. |
| 2013/0068285 A1 | 3/2013 | Ni et al. |
| 2013/0206935 A1 | 8/2013 | Majid et al. |
| 2014/0053607 A1 | 2/2014 | Angel |
| 2014/0090687 A1 | 4/2014 | Den Boer et al. |
| 2014/0116419 A1 | 5/2014 | Hernandez et al. |
| 2014/0130843 A1* | 5/2014 | Kostuk ............... H02S 40/22 136/246 |
| 2014/0160784 A1 | 6/2014 | Badandah et al. |
| 2014/0201109 A1 | 7/2014 | Tilley |
| 2014/0209146 A1 | 7/2014 | Park |
| 2014/0238387 A1 | 8/2014 | Kroyzer et al. |
| 2014/0251308 A1 | 9/2014 | Wyle et al. |
| 2014/0261387 A1 | 9/2014 | Hansen |
| 2014/0261392 A1 | 9/2014 | Lambrecht |
| 2014/0374550 A1 | 12/2014 | Straeter |
| 2015/0303867 A1 | 10/2015 | Angel |
| 2015/0316639 A1 | 11/2015 | Russ |
| 2015/0323124 A1 | 11/2015 | Erdos |
| 2016/0079461 A1 | 3/2016 | Angel et al. |
| 2016/0238189 A1 | 8/2016 | Angel |
| 2016/0251093 A1 | 9/2016 | Hijmans |

(56) References Cited

U.S. PATENT DOCUMENTS

FOREIGN PATENT DOCUMENTS

| | | |
|---|---|---|
| CN | 2597897 | 1/2004 |
| CN | 2599483 | 1/2004 |
| DE | 3104690 | 8/1982 |
| DE | 202007016715 | 3/2008 |
| EP | 1903155 | 3/2008 |
| EP | 1956662 | 8/2008 |
| EP | 1956662 | 12/2009 |
| FR | 2434343 | 4/1980 |
| GB | 770097 | 3/1957 |
| GB | 1529409 | 10/1978 |
| GB | 2471816 | 10/2012 |
| JP | 491610 | 1/1974 |
| JP | 58194751 | 11/1983 |
| JP | 6060934 | 4/1985 |
| JP | 2003069069 | 6/1986 |
| JP | 63021229 | 1/1988 |
| JP | 0598895 | 4/1993 |
| JP | 8194103 | 7/1996 |
| JP | 61119081 | 3/2000 |
| JP | 2000091612 | 3/2000 |
| JP | 2000243983 | 9/2000 |
| JP | 2003258291 | 9/2003 |
| JP | 2005206458 | 8/2005 |
| TW | 332104 | 11/2007 |
| WO | WO2005042420 | 5/2005 |
| WO | WO2008013976 | 1/2008 |
| WO | WO2008043871 | 4/2008 |
| WO | WO2009008996 | 1/2009 |
| WO | WO2009121174 | 10/2009 |
| WO | WO2010051599 | 5/2010 |
| WO | WO2010091391 | 8/2010 |
| WO | WO2012032462 | 3/2012 |
| WO | WO2012097260 | 7/2012 |
| WO | WO2015117134 | 8/2015 |

OTHER PUBLICATIONS

Royne et al., "Cooling of photovoltaic cells under concentrated illumination: a critical review", olar Energy Materials & Solar Cells 86 (2005) 451-483.*
Kinsey et al., "Concentrator Multifunction Solar Cell Characteristics Under Variable Intensity and Temperature", Prog. Photo volt: Res. Appl. 2008; 16:503-508.*
Kurtz, Sarah, "Opportunities and Challenges for Development of a Mature Concentrating Photovoltaic Power Industry", Technical Report NREL/TP-5200-43208 Revised Jun. 2011.*
Ortabasi et al., "Dish/Photovoltaic Cavity Converter (PVCC) System for Ultimate Solar-To-Electricty Conversion Efficiency General Concept and First Performance Predictions", Photovoltaic Specialists, IEEE Conference, 2002.*
Minano, Juan et al., "Free-form Optics for Fresnel-lens-based Photovoltaic Concentrators" Optics Express, vol. 21, No. S3, Apr. 22, 2013, pp. A496.
International Search Report and Written Opinion dated Jun. 9, 2016 from corresponding International Application PCT/US2016/013670.
International Search Report and Written Opinion dated Sep. 18, 2018 in PCT Application No. PCT/US18/30491.
Kumer et al. "Measuring Surface slope error on precision aspheres", (2007), Proc. Of SPIE vol. 6671., pp. 1-9.
International Preliminary Report on Patentability dated May 6, 2016 from International Application PCT/US2014/061584.
International Search Report and Written Opinion dated Jan. 27, 2015 from corresponding International Application PCT/US2014/061584.
International Preliminary Report on Patentability dated Jun. 11, 2015 from corresponding International Application PCT/US2013/071974.
International Search Report and Written Opinion dated Apr. 2,2014 from corresponding International Application PCT/US2013/071974.
Nishi et al., USPTO Translation of JP-60-60934, created Dec. 2015, pp. 1-22.
International Search Report and Written Opinion dated Aug. 25, 2009 from International Application PCT/US2009/043381.
International Search Report and Written Opinion from Int'l Application No. PCT/US09/043377 dated May 28, 2010.
International Preliminary Report on Patentability from Int'l Application No. PCT/US09/043381 dated Aug. 16, 2010.
International Search Report and Written Opinion from Int'l Application No. PCT/US09/043378 dated Jun. 9, 2010.
Reply to EPO Communication Pursuant to Rules 161(1) and 162 EPC from related EPC Application No. 09 747 260.9, based on PCT/US2009/043378.
International Preliminary Report on Patentability from Int'l Application No. PCT/US2009/043377 (corrected version) dated Jan. 20, 2011.
Reply to EPO Communication Pursuant to Rules 161(1) and 162 EPC from corresponding EPC Application No. 09 747 261.7, based on PCT/US2009/043381.
Reply to EPO Communication Pursuant to Rules 161(1) and 162 EPC from related EPC Application No. 09 747 259.1, based on PCT/US2009/043377.
Office Action dated Nov. 23, 2012 in German Application No. 11 2009 001 132.2-33.
Office Action dated Nov. 15, 2012 in Japanese Application No. 2011-509577.
Office Action dated Nov. 30, 2012 in Chinese Application No. 200980116969.2.
Office Action dated Oct. 30, 2012 in Application No. GB1019206.0.
Office Action dated Nov. 16, 2012 in Chinese Application No. 200980116959.9.
Office Action dated Nov. 23, 2012 in German Application No. 11 2009 001 135.7-33.
Office Action dated Dec. 4, 2012 in Mexican Application No. MX/a/2010/012356.
Office Action dated Sep. 13, 2012 in Mexican Application No. MX/a/2010/012355.
Examination Report dated Sep. 25, 2012 in European Application No. 09747261.7.
Office Action dated Aug. 22, 2012 in Japanese Application No. 2011-509579.
Examiner's Report dated Aug. 15, 2012 in Australian Application No. 2009246638.
Office Action dated Sep. 25, 2012 in Japanese Application No. 2011-509578.
Examination Report dated Jul. 10, 2012 in European Application No. 09747261.7.
Examination Report dated May 21, 2012 in European Application No. 09747260.9.
Office Action dated Jul. 13, 2012 in Mexican Application No. MX/a/2010/12356.
Combined Search and Examination Report dated Jul. 24, 2012 in Great Britain Application No. 1203267.8.
Examination Report dated Jul. 24, 2012 in Great Britain Application No. 1019139.3.
Office Action dated Jul. 3, 2012 in Chinese Application No. 20090116968.8.
Examiner's Report dated Feb. 23, 2012 in European Application No. 09747259.1.
Examiner's Report dated Feb. 26, 2012 in Great Britain Application No. 1019206.0.
AU; Examination Report dated May 9, 2011 in Application No. 2009246637.
GB; Examination Report dated Sep. 16, 2011 in Application No. GB1019160.9.
AU; Examination Report dated Oct. 4, 2011 in Application No. 2009246639.
DE; Office Action dated Jan. 10, 2012 in Application No. 11 2009 001 131.4-45.

(56) References Cited

OTHER PUBLICATIONS

AU; Examination Report dated May 10, 2011 in Application No. 2009246638.
KR; Notification of Provisional Rejection dated in Aug. 29, 2011 in Application No. 10-2010-7025551.
PCT; International Preliminary Report on Patentability dated Mar. 29, 2011 in Application No. PCT/US2009/043378.
GB; Examination Report dated Sep. 16, 2011 in Application No. GB1019139.3.
GB; Examination Report dated Jan. 11, 2012 in Application No. GB1019139.3.
USPTO; Restriction Requirement dated Dec. 2, 2016 in U.S. Appl. No. 14/632,637.
USPTO; Non-Final Office Action dated Jun. 17, 2015 in U.S. Appl. No. 14/071,417.
USPTO; Final Office Action dated Jan. 8, 2016 in U.S. Appl. No. 14/071,417.
USPTO; Advisory Action dated Mar. 24, 2016 in U.S. Appl. No. 14/071,417.
USPTO; Non-Final Office Action dated Aug. 17, 2016 in U.S. Appl. No. 14/071,417.
USPTO; Notice of Allowance dated Aug. 24, 2011 in U.S. Appl. No. 12/463,026.
USPTO; Notice of Allowance dated Oct. 4, 2012 in U.S. Appl. No. 12/463,016.
USPTO; Office Action dated Jan. 20, 2012 in U.S. Appl. No. 12/463,016.
USPTO; Office Action Restriction dated Oct. 11, 2011 in U.S. Appl. No. 12/463,016.
USPTO; Restriction Requirement dated Aug. 31, 2012 in U.S. Appl. No. 12/463,001.
USPTO; Non-Final Office Action dated Nov. 21, 2012 in U.S. Appl. No. 12/463,001.
USPTO; Notice of Allowance dated Mar. 5, 2013 in U.S. Appl. No. 12/463,001.
USPTO; Non-Final Office Action dated Feb. 14, 2013 in U.S. Appl. No. 13/302,084.
USPTO; Final Office Action dated May 29, 2013 in U.S. Appl. No. 13/302,084.
USPTO; Notice of Allowance dated Aug. 7, 2013 in U.S. Appl. No. 13/302,084.
PCT; International Search Report and Written Opinion dated Nov. 2, 2016 in Intl Application No. PCT/US16/45355.
USPTO; Non-Final Office Action dated Dec. 29, 2016 in U.S. Appl. No. 15/030,692.
USPTO; Restriction Requirement Office Action dated Feb. 14, 2017 in. U.S. Appl. No. 14/647,589.
USPTO; Final Office Action dated Apr. 21, 2017 in U.S. Appl. No. 14/071,417.
USPTO; Notice of Allowance dated May 1, 2017 in U.S. Appl. No. 15/030,692.
USPTO; Non-Final Office Action dated Jun. 20, 2017 in U.S. Appl. No. 14/647,589.
USPTO; Advisory Action dated Aug. 1, 2017 in U.S. Appl. No. 14/071,417.
USPTO; Non-Final Office Action dated Sep. 29, 2017 in U.S. Appl. No. 14/071,417.
USPTO; Notice of Allowance dated Apr. 12, 2018 in U.S. Appl. No. 14/647,589.
USPTO; Final Office Action dated Apr. 27, 2018 in U.S. Appl. No. 14/071,417.
USPTO; Restriction requirement Office Action dated Apr. 5, 2018 in U.S. Appl. No. 15/543,625.
Office Action dated Nov. 23, 2012 in Ferman Application No. 11 2009 001 132.2-33.
Decision to Grant Pursuant to Article 97(1) EPC dated Mar. 28, 2013 from EP Application No. 09747261.7.
DE; Office Action dated Jun. 30, 2015 in Application No. 11 2009 001 131.4-45.
DE; Office Action dated Mar. 13, 2018 in Application No. 11 2009 001 131.4-45.
MX; 1st Office Action dated May. 27, 2013 in Mexico Application No. 10/12354.
MX; 2nd Office Action dated Dec. 21, 2013 in Mexico Application No. 10/12354.
MX; 3rd Office Action dated Aug. 5, 2014 in Mexico Application No. 10/12354.
CN 2nd OA dated Oct. 14, 2013 in Chinese Application No. 200980116959.9.
IN First Examination Report dated Oct. 13, 2014 in Indian Application No. 4323/KOLNP/2010.
CA First Office Action dated Nov. 27, 2012 in Canadian App No. 2722714.
Canadian Notice of Allowance dated Mar. 14, 2014 in Canadian App No. 2722714.
EP Comunication pursuant to Article 94(3) EPC dated Jul. 8, 2015 in EP Application No. 09747260.9.
DE Office Action dated Apr. 12, 2018 in German Application No. 112008001135.7.
JP Notice of Allowance dated May 21, 2013 from JP Application No. 2011-509578.
CN 2nd Office Action dated Jun. 3, 2013 in Chinese Application No. 200980116968.8.
CN Third Office Action dated Dec. 23, 2013 in Chinese Application No. 200980116968.8.
First Examination Report dated Nov. 30, 2015 in India Application No. 4327/KOLNP/2010.
Exam Report in Chile Application No. 2015-01453.
International Search Report and Written Opinion dated May 3, 2016 from corresponding International Application PCT/US2016/20415.
International Preliminary Report on Patentability dated Sep. 14, 2017 from International Application PCT/US2014/06/020415.
International Preliminary Report on Patentability dated Dec. 21, 2017 from International Application PCT/US2016/035606.
International Search Report and Written Opinion dated Sep. 13, 2016 from corresponding International Application PCT/US2016/036506.
International Preliminary Report on Patentability dated Jul. 27, 2017 from International Application PCT/US2016/013670.
International Preliminary Report on Patentability dated Feb. 15, 2018 from International Application PCT/US2016/45355.
Leland, J. E90: Self-Replicating Milling Machine. Blog with photos (online). Swarthmore College, 2012. (Retrieved on Jul. 31, 2013).
Dan Friedman, National Solar Technology Roadmap: Concentrator PV, Management Report NREL/MP-520-41735, Solar Energy Technologies Program, Jun. 2007, pp. 1-3.
Geoffrey S. Kinsey, et al., Multijunction Solar Cells for Dense-Array Concentrators, pp. 625-627, 2006, 1-4244-0016-3, IEEE.

* cited by examiner

MICRO-SCALE CONCENTRATED PHOTOVOLTAIC MODULE

CROSS REFERENCE TO RELATED APPLICATIONS

This application is a U.S. National Phase filing under 35 U.S.C. § 371 of PCT/US2016/013670, filed on Jan. 15, 2016, which claims priority to U.S. Provisional Patent Application Ser. No. 62/104,455 filed on Jan. 16, 2015, both of which are incorporated herein by reference in their entirety.

FIELD

The present disclosure relates to energy production, and more particularly, to photovoltaic modules.

BACKGROUND

Conventional solar concentrators are large and cannot be easily installed in residential locations. Existing concentrated photovoltaic ("PV") modules tend to have narrow concentrator acceptance angles, bulky modules, and do not effectively collect both direct normal incident ("DNI") light and diffuse light. Existing concentrated PV designs limit their deployment to locations with a high percentage of DNI radiation due to poor cost effectiveness and poor efficiency at other locations.

SUMMARY

A photovoltaic module may comprise a silicon cell, a multi junction cell coupled to the silicon cell, and a lens embedded in a substrate, wherein the lens is configured to direct light to the multi junction cell, and wherein the substrate is configured to direct diffuse light to the silicon cell.

In various embodiments, the photovoltaic module may comprise a light pipe coupled to the lens. The light pipe may be coupled to the multi junction cell via a gel. The light pipe, the lens, and the substrate may be a single integral component. The lens may be circular. The lens may be cylindrical. A shape of the lens may be a freeform optical surface.

A photovoltaic module may comprise an array substrate, a plurality of lenses embedded within the array substrate, a plurality of light pipes, wherein each light pipe in the plurality of light pipes is coupled to a corresponding lens in the plurality of lenses, a silicon cell configured to receive diffuse light passing through the array substrate, and a plurality of multi junction cells coupled to the silicon cell, wherein each of the plurality of multi-junction cells is configured to receive concentrated light from a corresponding light pipe in the plurality of light pipes.

In various embodiments, the plurality of lenses may comprise circular lenses arranged in a square array. The array substrate, the plurality of lenses, and the plurality of light pipes may be a single integral glass component. The plurality of multi junction cells may comprise a plurality of rows of multi junction cells, wherein the multi junction cells in each row of multi junction cells are connected in series. The plurality of lenses may be coplanar. Each of the plurality of multi junction cells may be coupled to the corresponding light pipe in the plurality of light pipes via a gel. The plurality of multi junction cells may comprise GaInP2/GaAs/Ge based triple-junction cells.

An integral glass solar concentrator may comprise an array substrate, a dome extending above the array substrate, a cone extending below the array substrate, and a light pipe extending from an apex of the cone.

In various embodiments, the dome may be configured to concentrate direct normal incident light through the cone and into the light pipe. The light pipe may comprise a diameter smaller than a diameter of the dome. The integral glass solar concentrator may comprise a plurality of domes extending above the array substrate. A diameter of the light pipe may be less than 1.0 mm. The array substrate may be configured to transmit diffuse solar radiation.

A micro-optic illuminator may comprise an array substrate, a lens embedded within the array substrate, a light pipe coupled to the lens, and an optical device coupled to a substrate, wherein the optical device is configured to at least one of: emit light through the light pipe and through the lens; or absorb light collected by the lens.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of various embodiments herein makes reference to the accompanying drawings, which show various embodiments by way of illustration. While these various embodiments are described in sufficient detail to enable those skilled in the art to practice the inventions, it should be understood that other embodiments may be realized and that logical changes and adaptations in design and construction may be made in accordance with this invention and the teachings herein. Thus, the detailed description herein is presented for purposes of illustration only and not of limitation. The scope of the invention is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

An electro-optical module system that may be used as part of an illuminator module or a photovoltaic ("PV") module is disclosed. A PV module may comprise an array of micro-optics and an array of PV cells. An illuminator module may comprise the array of micro-optics and an array of optical devices which may receive light. The module may be a flat panel with a nominal thickness smaller than the length and width of the flat panel. An array of lenses may be embedded in an array substrate. The lenses may be coupled to light pipes. The lenses may concentrate light through the light pipes to multi junction cells. Diffuse light may be transferred through the array substrate to a silicon cell. The lenses and light pipes may be manufactured using a molding and drawing process.

Figure 1A:
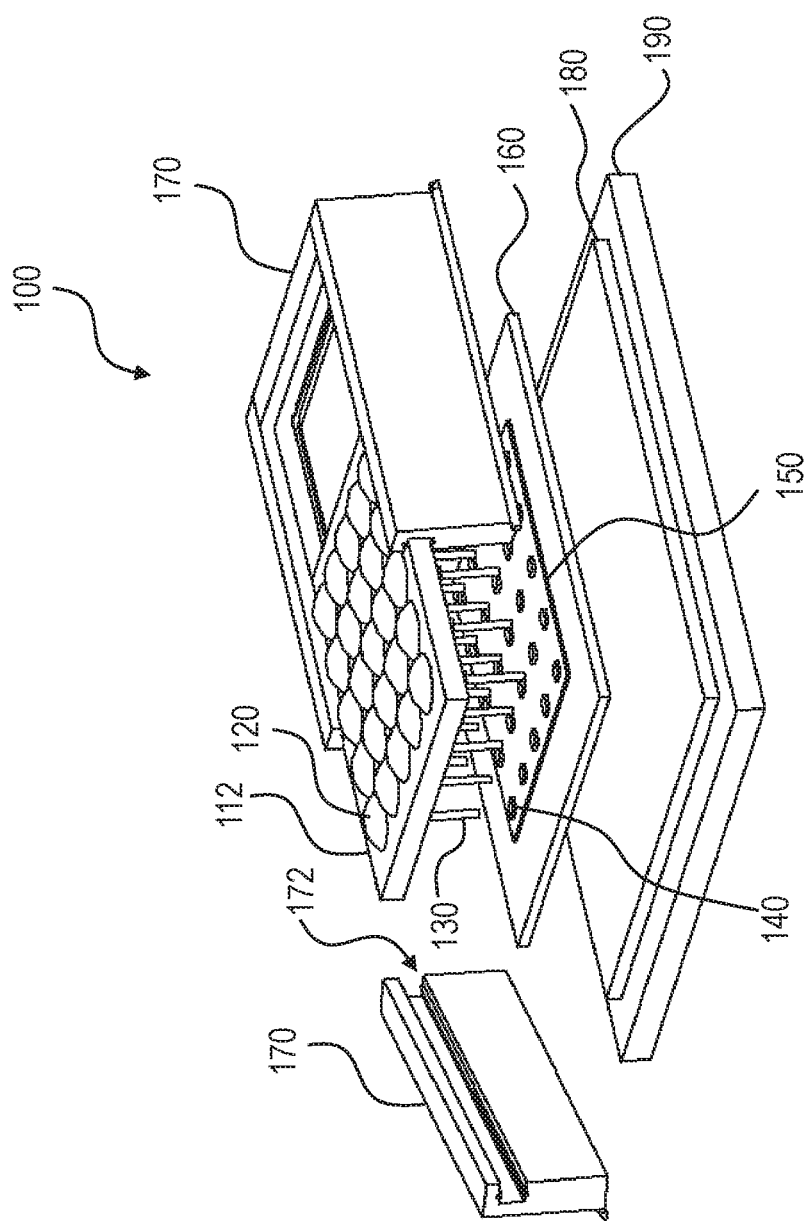
FIG. 1A illustrates a perspective view of a partially assembled PV module, in accordance with various embodiments.
Figure 1B:
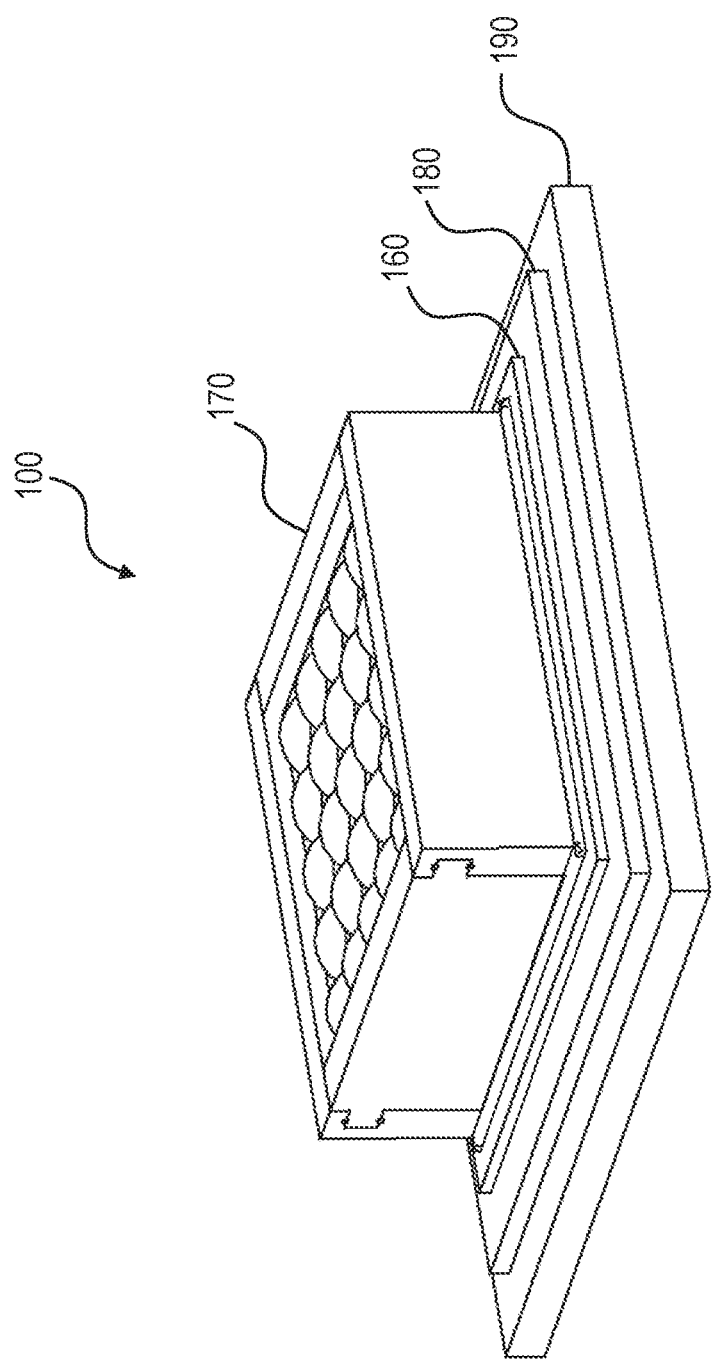
FIG. 1B illustrates a perspective view of a fully assembled PV module, in accordance with various embodiments.

Referring to FIGS. 1A and 1B, a perspective view of a PV module 100 is illustrated according to various embodiments. FIG. 1A illustrates the PV module 100 partially assembled, and FIG. 1B illustrates the PV module 100 fully assembled. The PV module 100 may comprise an array of lenses 120. The lenses 120 may be supported by an array substrate 112. The array substrate 112 may be planar, such that the lenses 120 are coplanar within the array substrate 112. The lenses 120 may be circular. Each lens 120 may be coupled to a light pipe 130 (also referred to as an optical waveguide). As illustrated, the array may comprise a square 5×5 array of lenses 120. However, many other sizes of square arrays, rectangular arrays, circular arrays, or irregular arrays may be used. Each light pipe 130 may be cylindrical and coaxial with the corresponding lens 120. The light pipe 130 may extend from the lens 120 to a multi junction cell 140. Various types of multi junction cells 140 may be suitable for the PV module. In various embodiments, the multi junction cells 140 may comprise $GaInP_2$/GaAs/Ge based triple-junction cells. A plurality of multi-junction cells 140 may be coupled to and positioned on top of a silicon cell 150. The PV module 100 may comprise one multi junction cell 140 for each light pipe 130. The silicon cell 150 may be coupled to a substrate 160. In various embodiments, the substrate 160 may be a heat sink.

The lenses 120 may collect direct normal incident ("DNI") light and concentrate the light into the light pipes 130. In various embodiments, the lenses may have a concentration ratio of 10×-500×. The light pipes 130 may redirect and homogenize the light. The light pipes 130 may direct the light to the multi junction cells 140. The light pipes 130 may have a diameter significantly smaller than the diameter of the lenses 120. In various embodiments, the light pipes 130 may have a diameter of approximately 1 mm or less, and the lenses 120 may have a diameter of approximately 10 mm. The light pipes may be a multimode waveguide, and the diameter of the light pipes 130 may be greater than lambda/n, where lambda is the wavelength of the principle component of light, and n is the refractive index of the material of the light pipes 130 at that wavelength. In various embodiments, the aspect ratio of the light pipes 130 may be greater than 1:1, wherein the aspect ratio is defined as the diameter to the height. In various embodiments, the aspect ratio may be between 1:1 to 1:10 (i.e. the height of the light pipes 130 may be between one to ten times the diameter of the light pipes 130).

The multi junction cells 140 may be square and have dimensions of 1 mm×1 mm. Thus, the light collected by the lenses 120 may be concentrated onto the multi junction cells 140 which occupy a small fraction of the surface area of the silicon cell 150. Diffuse light which passes through the array substrate 112 or the lenses 120 may be collected by the silicon cell 150. By utilizing multi junction cells 140 which are small relative to the size of the silicon cell 150, a variety of benefits may be achieved. For example, the spacing between adjacent multi junction cells 140 may be at least five times the width of the multi-junction cells 140. Thus, the heat exchanged between adjacent multi junction cells 140 may be minimal, which allows for more efficient cooling and greater efficiency of the multi-junction cells 140. Additionally, the small size of the multi junction cells 140 may allow for greater design flexibility for placement of wires and other components on the silicon cell 150. Decreasing the size of the multi junction cells 140 also increases the effective collection area of the silicon cell 150.

In various embodiments, a thin layer of silicone gels may be applied on the top surface of each multi junction cell 140. The silicone gels may bring the multi junction cells 140 into contact with the light pipes 130. UV radiation may be used to cure the silicone gels.

The array substrate 112 may be slid into channels 172 on the interior of module walls 170. Four module walls 170 may be coupled to the substrate 160. The module walls 170 may be coupled to the array substrate 112 and the substrate 160 via adhesive or mechanical fasteners. The interior of the PV module 100 may be hermetically sealed between the substrate 160, the array substrate 112, and the module walls 170. Air in the interior of the PV module 100 may be replaced with a gas, such as Argon or Krypton. In various embodiments, silica desiccant may be placed in the interior of the PV module to absorb small amounts of moisture. The substrate 160 may be coupled to a printed circuit board ("PCB") 180. The PCB 180 may comprise through-hole electrical connections to connect to the various contacts on the silicon cell 150. The PCB 180 may be coupled to a plate 190. The plate 190 may comprise another PCB or aluminum plate with external electrical input/output connections. The PV module 100 may be mounted on a tracking system to maintain a desired orientation relative to incident sunlight. In various embodiments, the tracking system may be a single-axis or dual-axis tracking system.

Electrodes and connecting wires can be fabricated on the silicon cell 150 that act as a circuit board substrate where the multi junction cells 140 can be placed. The size of the electrodes and wires can be designed to occupy small areas so as not to obscure solar light incident on the silicon cell 150. Dicing, bonding and packaging of micro-cells can be performed by existing dicing and pick-and-place equipment. The silicon cell 150 is utilized to collect diffuse solar radiation which is not collected by the lenses 120. Some DNI solar radiation may also be collected by the silicon cell 150, depending on reflection and cell configurations. The lenses 120 can have anti-reflection coating to maximize transmission of diffuse solar light. The entire PV module 100 can be mounted on top of a heat sink. The lenses 120 may be designed to have low field of view (FOV), typically around 1 degree. Thus, the PV module 100, including the heat sink, can be mounted on solar tracker to improve collection efficiency.

Figure 2:
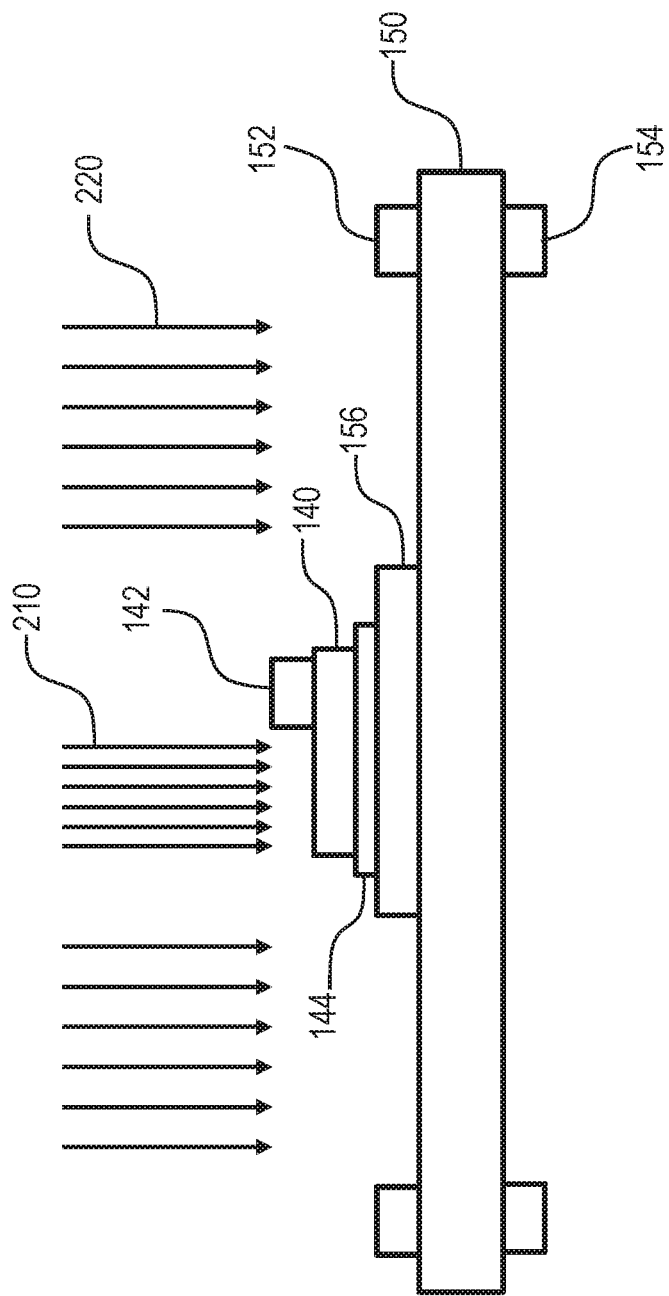
FIG. 2 illustrates a cross-section view of a silicon cell and one multi junction cell, in accordance with various embodiments.

Referring to FIG. 2, a cross-section view of the silicon cell 150 and one multi-junction cell 140 is illustrated according to various embodiments. The silicon cell 150 may comprise front contacts 152 and back contacts 154. The multi junction cell 140 may comprise a front contact 142 and a back contact 144. The multi junction cell 140 may be coupled to the silicon cell 150 via a dielectric layer 156 located between the back contact 144 and the silicon cell 150. The multi junction cell 140 may collect concentrated light rays 210 from the light pipe, and the silicon cell 150 may collect diffuse light rays 220.

Figure 3A:
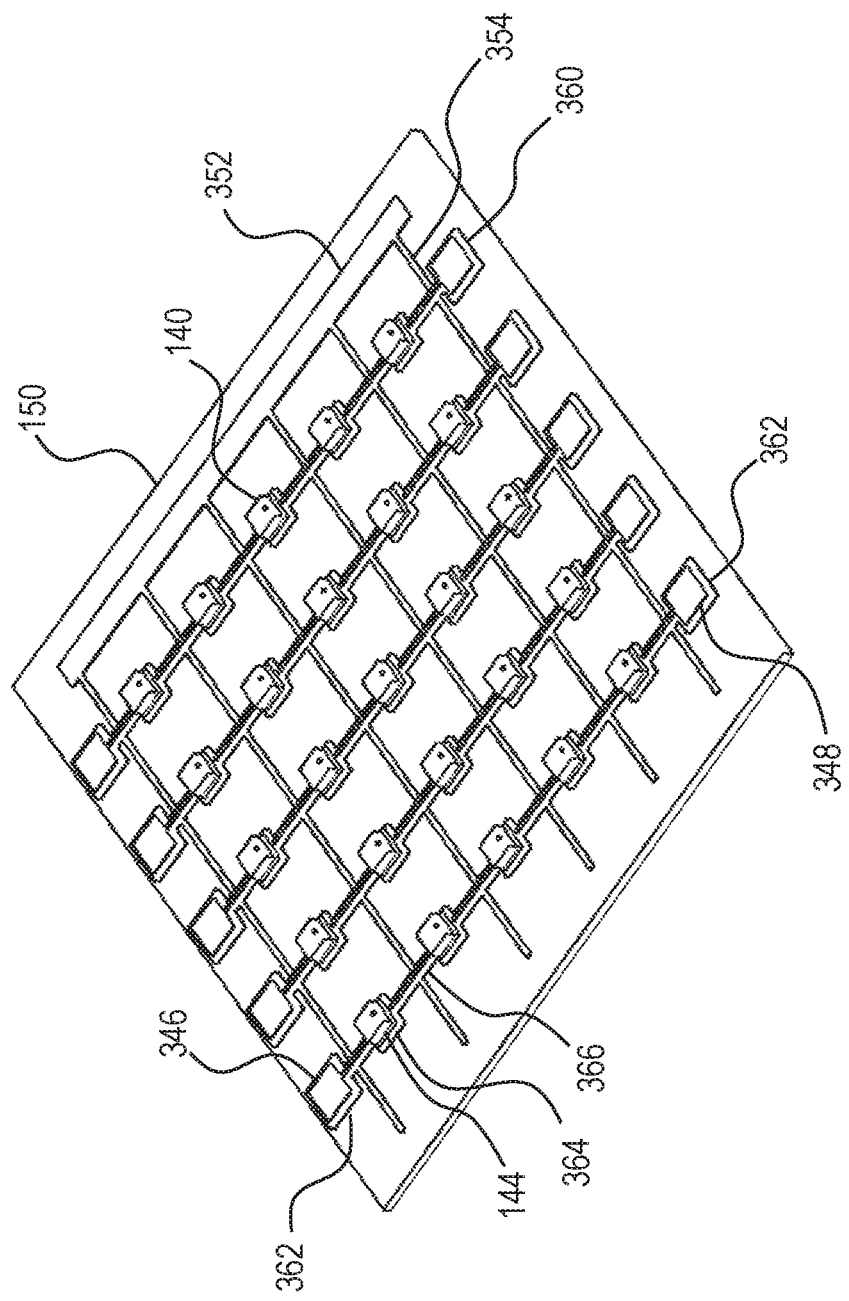
FIGS. 3A and 3B illustrate a perspective view of the silicon cell with multi junction cells, and an enlarged perspective view of a portion of the silicon cell with multi junction cells, in accordance with various embodiments.
Figure 3B:
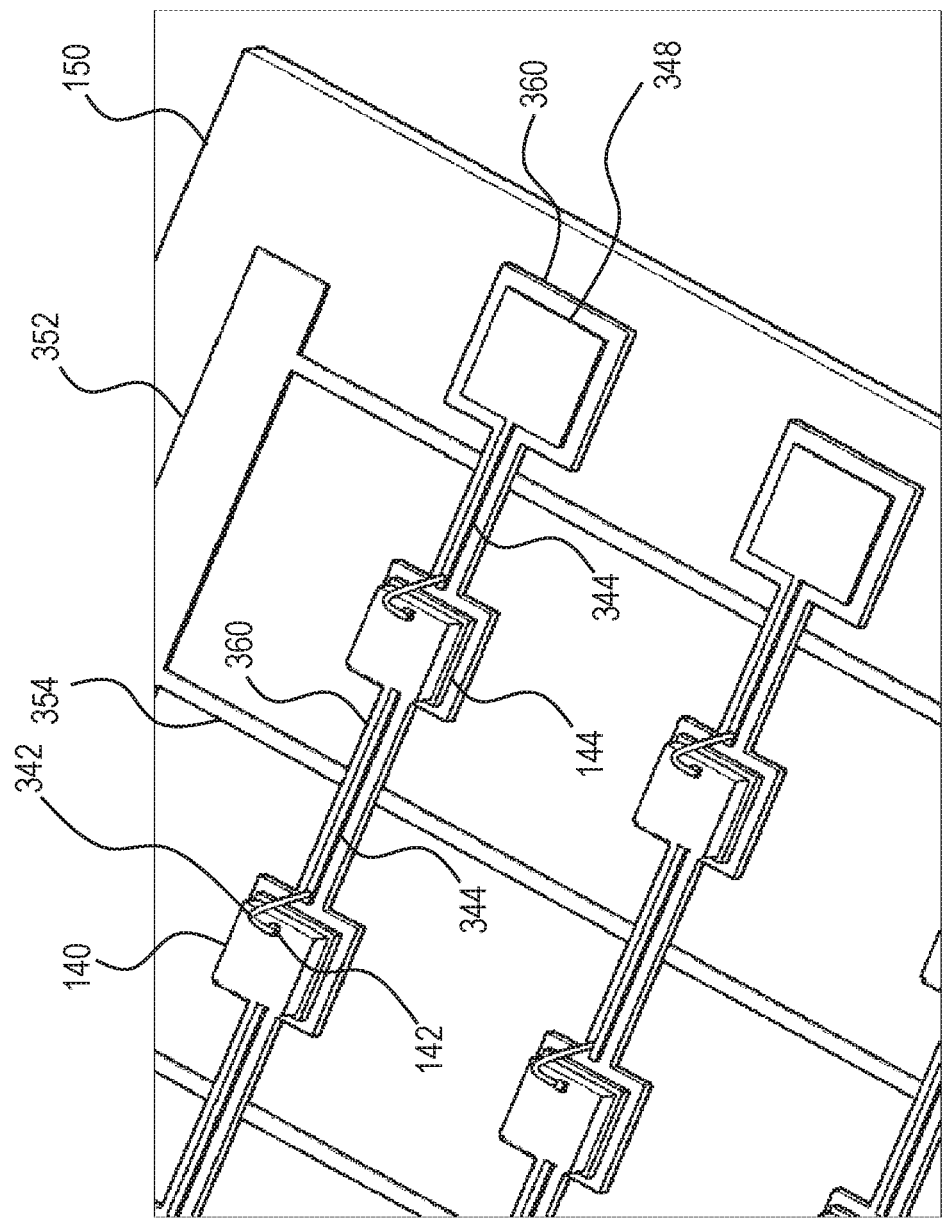

Referring to FIGS. 3A and 3B, a perspective view of the silicon cell 150 with multi-junction cells 140, and an enlarged perspective view of a portion of the silicon cell 150 with multi junction cells 140 are illustrated according to various embodiments. A busbar 352 and grids 354 may be located on a top surface of the silicon cell 150. A dielectric layer 360 may be coupled to the silicon cell 150 overlapping the grids 354. Each dielectric layer 360 may comprise contact pads 362, multi junction cell pads 364, and pathways 366 between adjacent pads. A separate dielectric layer 360 may be present for each row of multi junction cells 140. As illustrated, five rows of multi junction cells 140 are present, thus five dielectric layers 360 are present. A multi junction cell 140 may be located on each multi-junction cell pad 364. A wire bond 342 may be coupled to the multi junction cell front contact 142 and a grid 344 located on top of the pathways 366. Each multi junction cell 140 in a row may be connected in series. Thus, an electrical path may start at a first contact 346 located on a contact pad 362, continue through the grid 344 which is coupled to a back contact 144 of a multi junction cell 140, continue through the multi junction cell 140, exit the multi junction cell 140 at the front contact 142 of the multi junction cell 140, continue through the wire bond 342 to the grid 344, and continue in such manner through each multi-junction cell 140 until terminating at a second contact 348 located on a contact pad 362.

Figure 4:
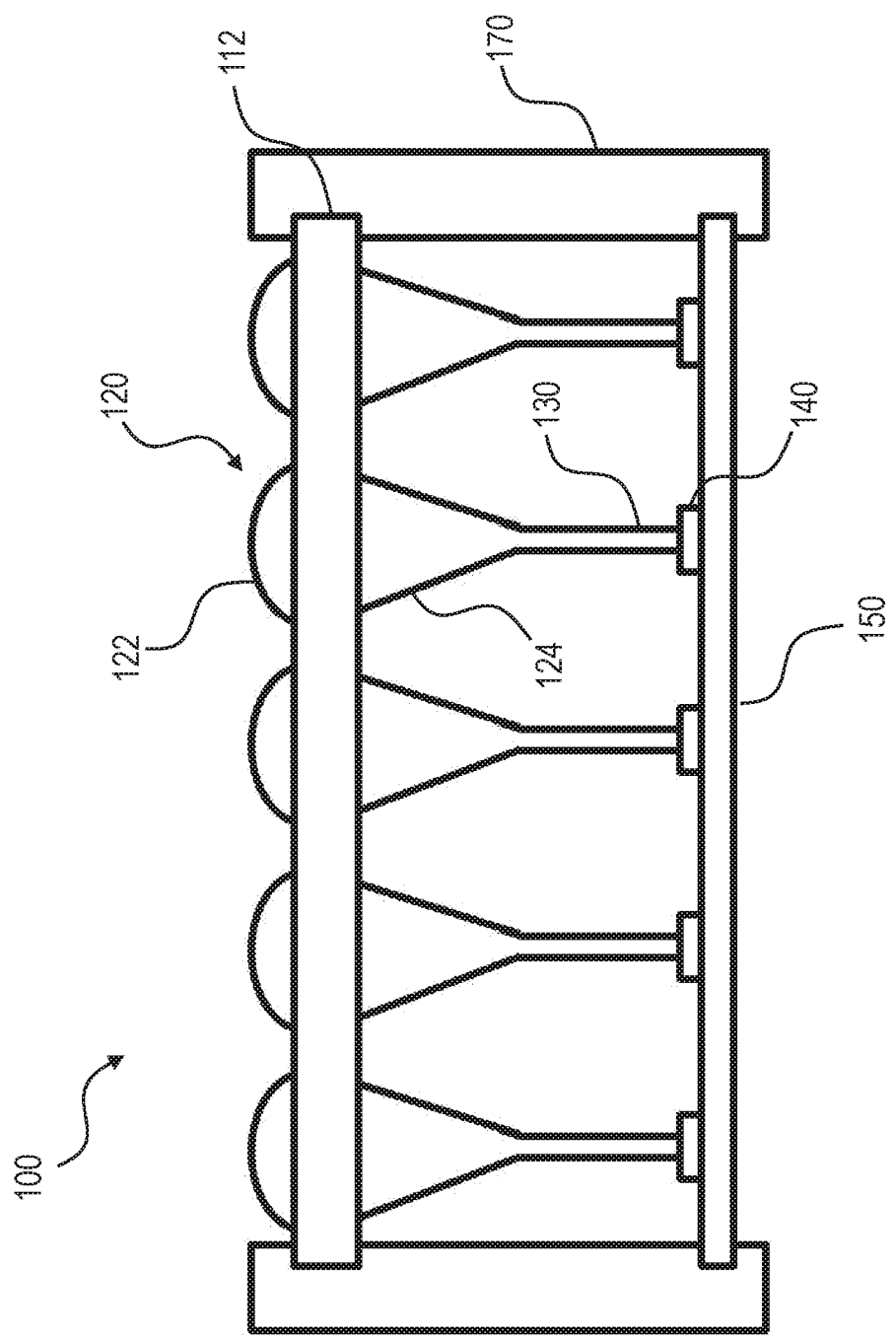
FIG. 4 illustrates a cross-section view of the PV module, in accordance with various embodiments.
Figure 5A:
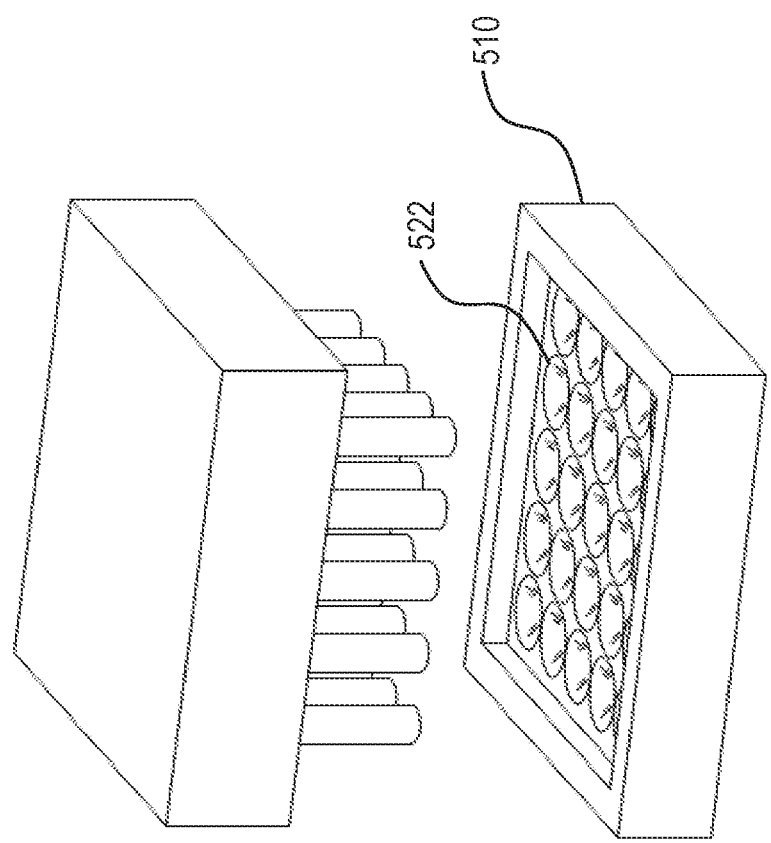
FIGS. 5A through 5E illustrate a process for manufacturing a solar concentrator array, in accordance with various embodiments.
Figure 5B:
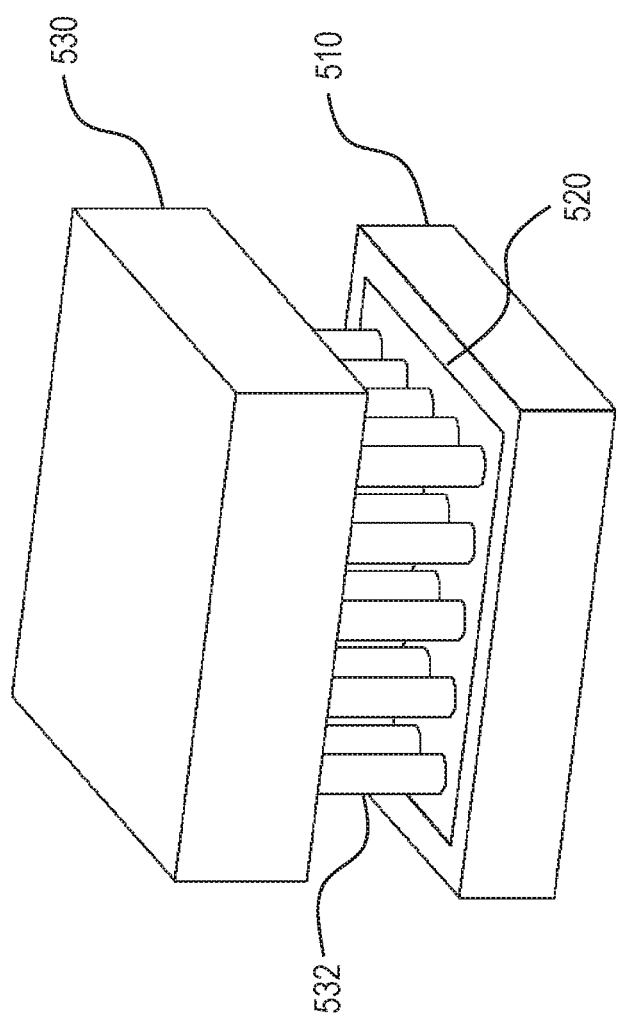
Figure 5C:
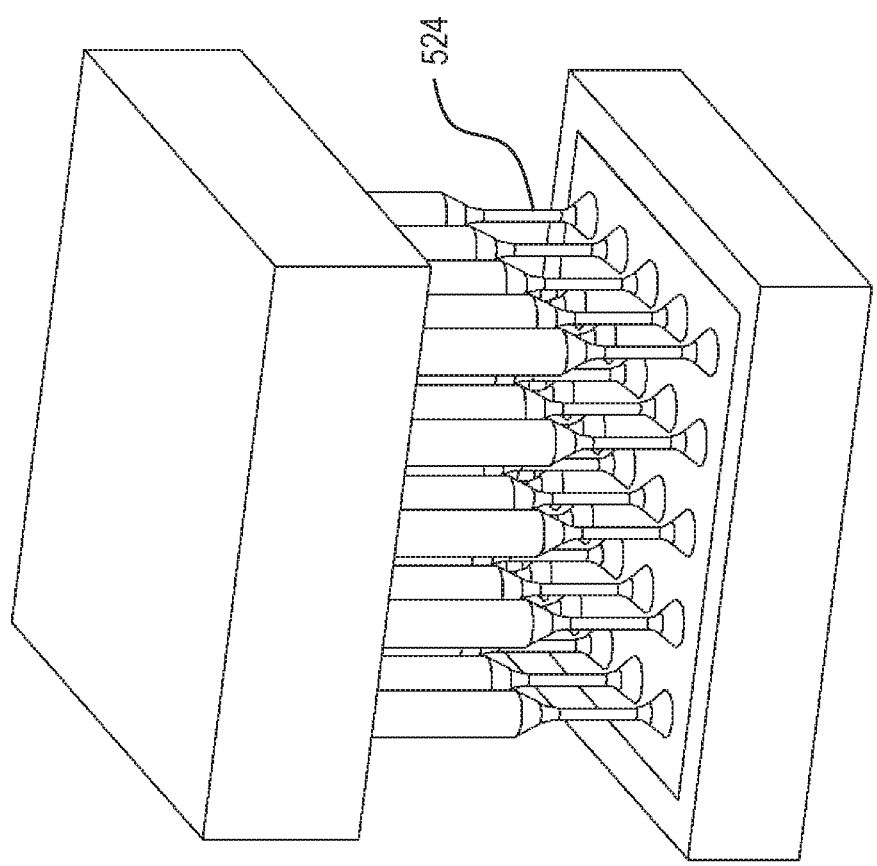
Figure 5D:
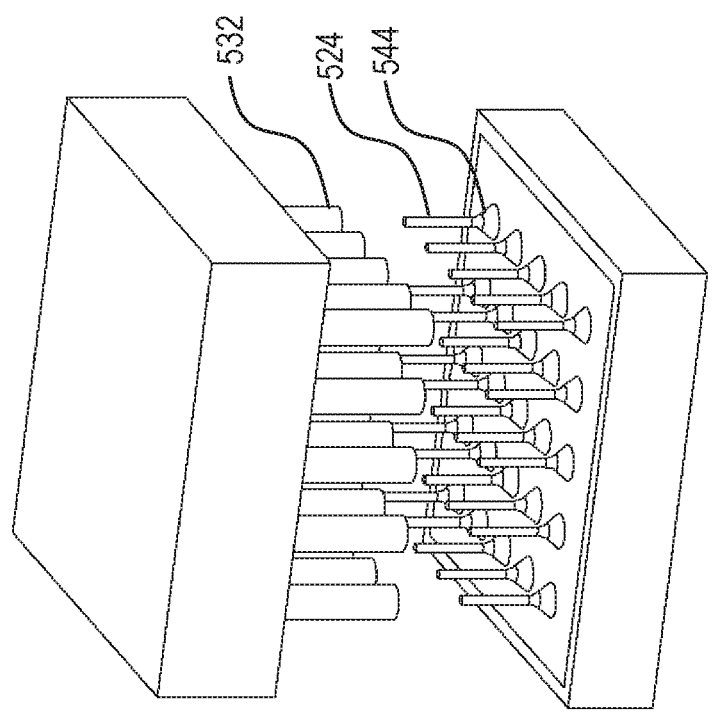
Figure 5E:
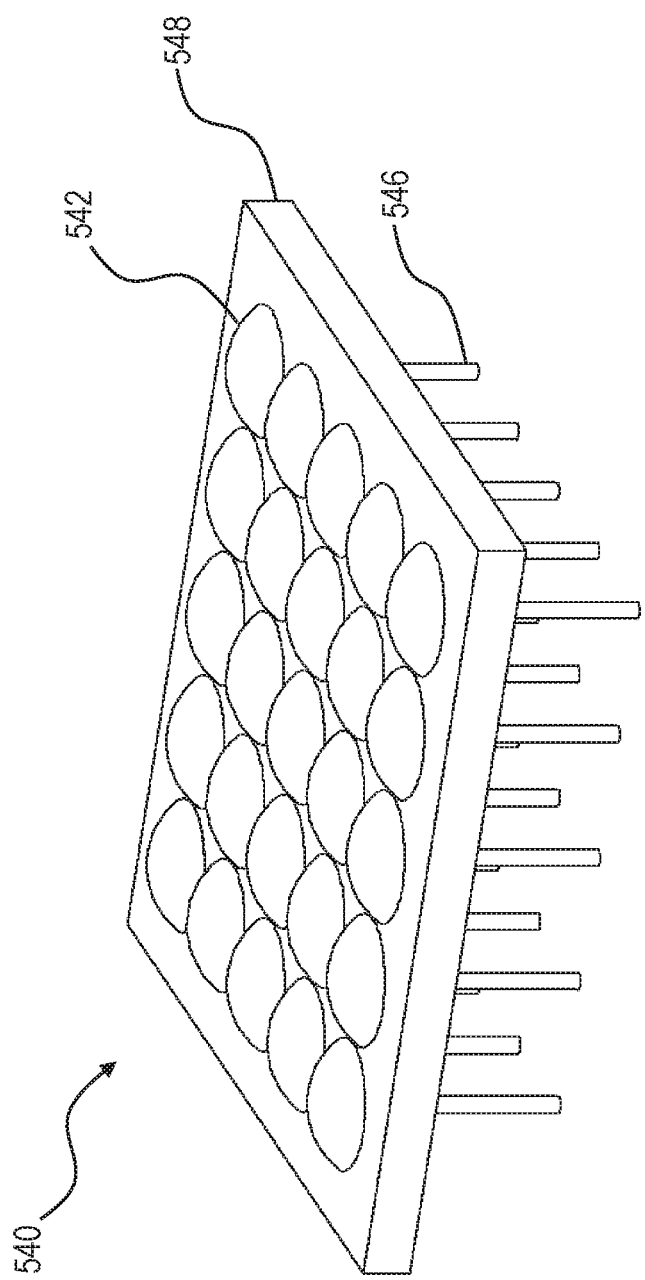

Referring to FIG. 4, a cross-section view of the PV module 100 is illustrated according to various embodiments. The PV module 100 may comprise module walls 170. The module walls 170 may be coupled to the array substrate 112. The array substrate 112 may support the lenses 120. Each lens 120 may comprise a dome 122 which protrudes above the array substrate 112, and a cone 124 which extends below the array substrate 112. The cone 124 may transition into the light pipe 130. The dome 122 may collect incident light and concentrate the light through the cone 124 into the light pipe 130. The light pipe 130 may direct the light onto the multi junction cell 140. Diffuse light passing through the lenses 120 or through the array substrate 112 may be collected by the silicon cell 150. The module walls 170 may be coupled to the silicon cell 150 or a heat sink coupled to the silicon cell 150. The shape of the dome 122 and the light pipe 130 may be a freeform optical surface. Freeform optics are non-symmetric surface forms in optical components.

Referring to FIGS. 5A through 5E, a process for manufacturing a solar concentrator array is illustrated according to various embodiments. The micro-optics components can be fabricated by a combination of glass molding and glass drawing. A micro-lens array can be fabricated using glass or polymer by conventional molding. The array is subsequently pulled to create the connecting light pipe. The solar concentrators described herein may have dimensions less than 0.5 mm and large aspect ratios, making them very difficult to construct using conventional techniques. A recently developed technique called drawing lithography has been successfully applied to make high aspect micro-needles and serves as starting point. Low transformation temperature ($T_g$) glasses with $T_g<550°$ C. may be used as materials. Glass has the advantages of durability under ultraviolet illumination and generally has lower optical loss. Stainless steel with a thermal coefficient similar to glass and a high melting point of 1500° C. may be used as the mold 510. The mold 510 may be constructed by precision machining technology with the geometries of the lens array (see FIG. 5A). The shape of the mold may be designed to take into account the deformation from subsequent drawing. Preformed glass materials 520 placed in the mold 510 are put in an oven (see FIG. 5B). The oven temperature is increased to above the glass melting temperature ($T_m \sim 900°$ C.), to obtain fully molten glass in the mold 510. This high temperature, $T>T_m$, is sustained for several minutes, so the free-flowing liquid glass 520 forms to the contour of a lens array at the contact surface of the mold 510 and liquid glass 520. A drawing plate 530 with stainless steel rods 532 (about 2 mm in diameter), controlled by a syringe pump, may contact the molten glass free surface. The axial center of each rod 532 is precisely aligned to the center of the corresponding circular lens 522. In various embodiments, the lenses 522 may be non-circular, with the shape of the lenses 522 defined by a polynomial. When the rods 532 are engaged with the glass surface, full contacts between the rods 532 and the liquid glass 520 are formed. The oven temperature is then reduced in the range of $T_m>T>T_g$, while the drawing plate 530 is withdrawn away from the glass free surface at a constant rate. $T_g$ is the glass-transition temperature. Glass fibers 524 may be created due to the axial tensile force (see FIG. 5C). The desired fiber diameter can be obtained by optimizing the drawing rate and the temperature-dependent glass viscosity. With further reduction in temperature, $T<T_g$, the glass fibers 524 break from the rods 532 (see FIG. 5D). The glass piece can be cooled down to room temperature ($T_r$). To achieve desired length and finish, laser cutting/etching can be performed. The resultant solar concentrator 540 may be removed from the mold 510 (see FIG. 5E). The resultant solar concentrator 540 may comprise the lenses 542, cones 544 (see FIG. 5D), light pipes 546, and an array substrate 548 surrounding the lenses 542. Thus, the solar concentrator 540 may be a single integral glass component.

Figure 6:
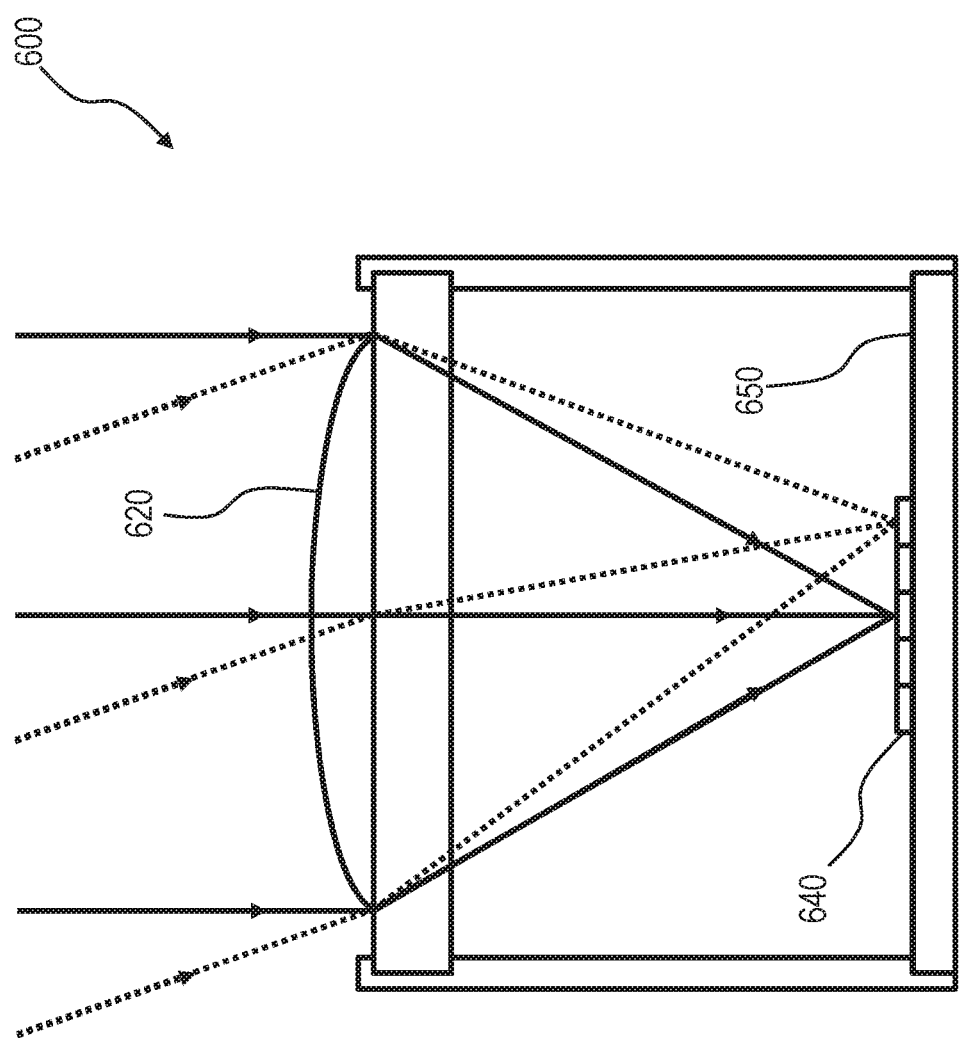
FIG. 6 illustrates a PV module without light pipes, in accordance with various embodiments.

Referring to FIG. 6, a cross-section view of a PV module 600 without light pipes is illustrated according to various embodiments. The PV module 600 may comprise a single lens or an array of lenses mounted on top of a PV cell array. The PV module 600 may be utilized without solar tracking by using redundant PV cells. FIG. 6 illustrates a single microlens 620 on top of an array of high efficiency multi junction cells 640. As the position of the sun changes during the day and season, the angle of the incident light changes relative to the lens 620, resulting in a shift of the focal point. Instead of moving the PV module 600 to compensate for the focal shift, the PV module 600 remains stationary and an array of multi junction cells 640 is placed along the path of the focal shift. The size of the multi-junction cells 640 may be determined by the focal spot size. The path and the number of multi junction cells 640 may be calculated based on the location of the PV module 600 (i.e. longitudinal and latitudinal coordinates) and can be optimized based on requirements of the PV module 600 (i.e. cost, size, efficiency). The multi junction cells 640 are designed to collect concentrated solar light and are placed on top of a low cost PV cell 650 which acts as a substrate. As described with reference to FIG. 1, the low cost PV cell 650 may be utilized to collect diffuse solar light not collected by the lenses 620.

Figure 7:
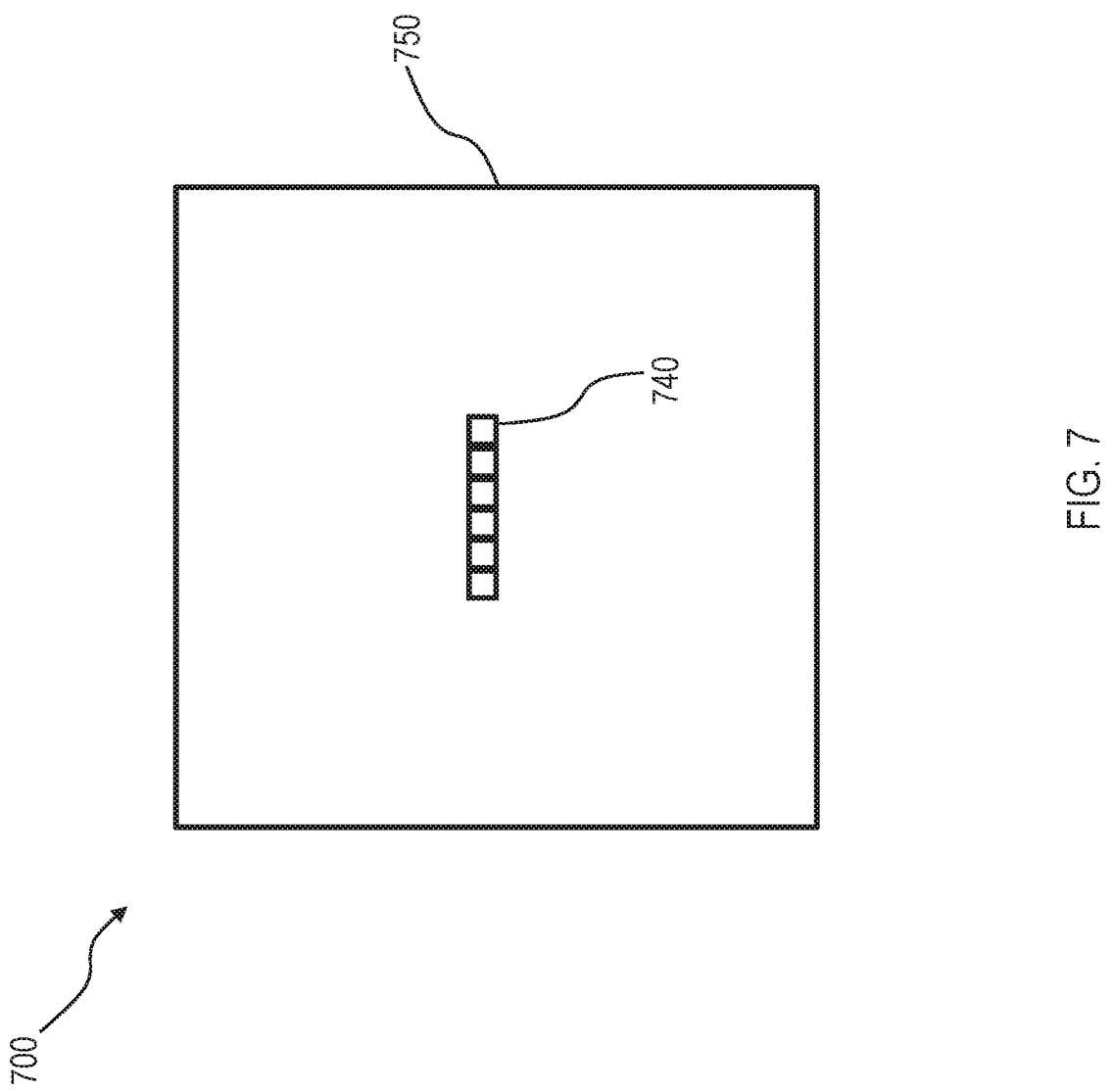
FIG. 7 illustrates a top view of a PV cell array, in accordance with various embodiments.

Referring to FIG. 7, a top view of a PV cell array 700 for use in conjunction with the PV module of FIG. 6 is illustrated according to various embodiments. The PV cell array 700 may comprise a plurality of multi junction cells 740 in a single row. The multi junction cells 740 may be placed on a low cost PV cell 750 (such as a silicon PV cell) which collects diffuse light. As the position of the sun moves, the concentrated light from a lens may be directed to different multi junction cells 740, allowing for concentrated light to be collected without utilizing a tracking system.

Figure 8:
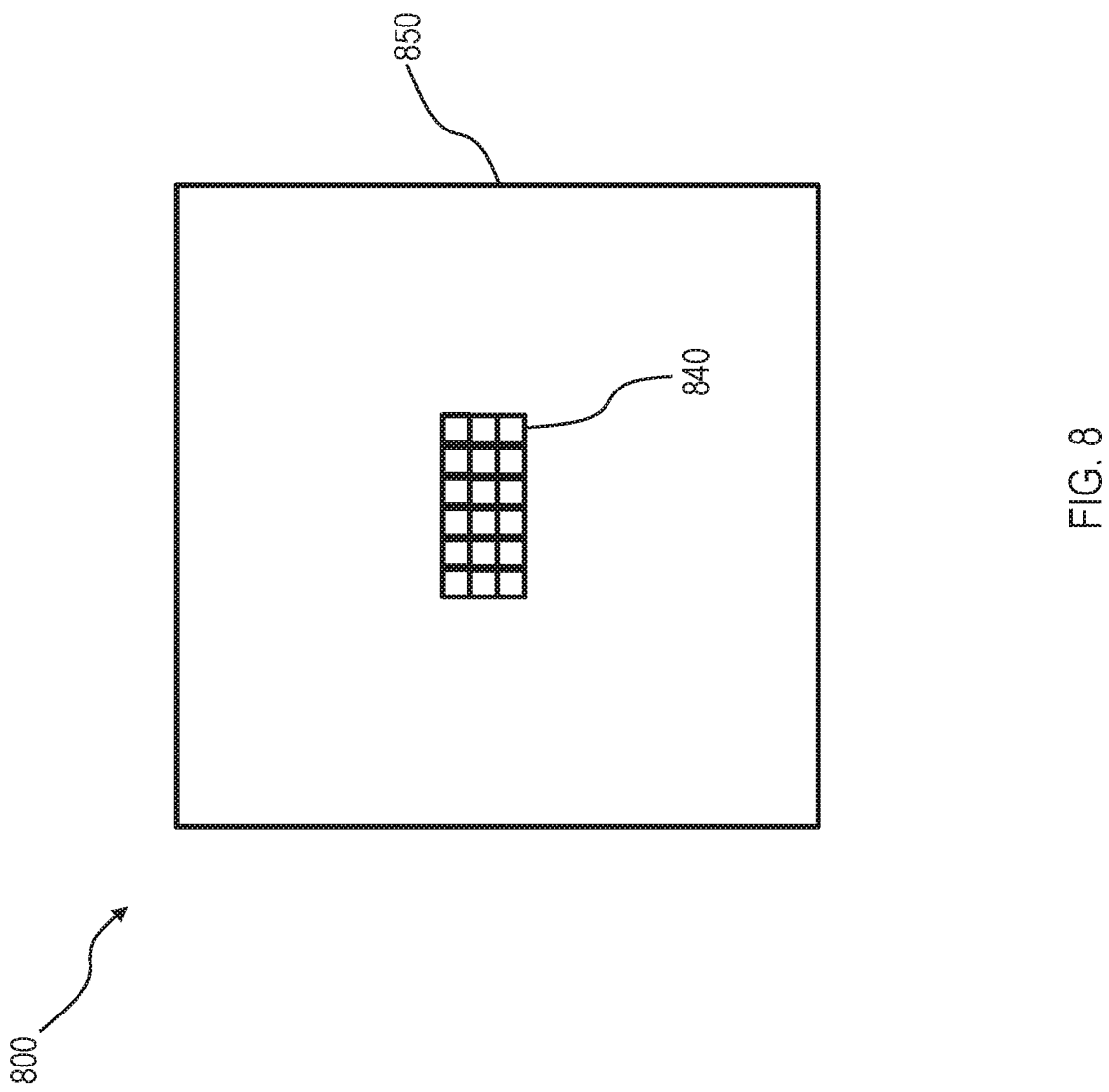
FIG. 8 illustrates a top view of a PV cell array with multiple rows, in accordance with various embodiments.

Referring to FIG. 8, a top view of a PV cell array 800 with multiple rows for use in conjunction with the PV module of FIG. 6 is illustrated according to various embodiments. The PV cell array 800 may comprise a plurality of multi junction cells 840 in multiple rows. The multi junction cells 840 may be placed on a low cost PV cell 850 (such as a silicon PV cell) which collects diffuse light. As the position of the sun moves, the concentrated light from a lens may be directed to different multi junction cells 840, allowing for concentrated light to be collected without utilizing a tracking system, even though the focal point of the lens may move in two dimensions. Although illustrated as a rectangular array of 3×6 multi-junction cells 840, any shape of array may be formed in order to optimize the location of multi junction cells 840 based on the expected locations of the focal point of the lens.

Figure 9:
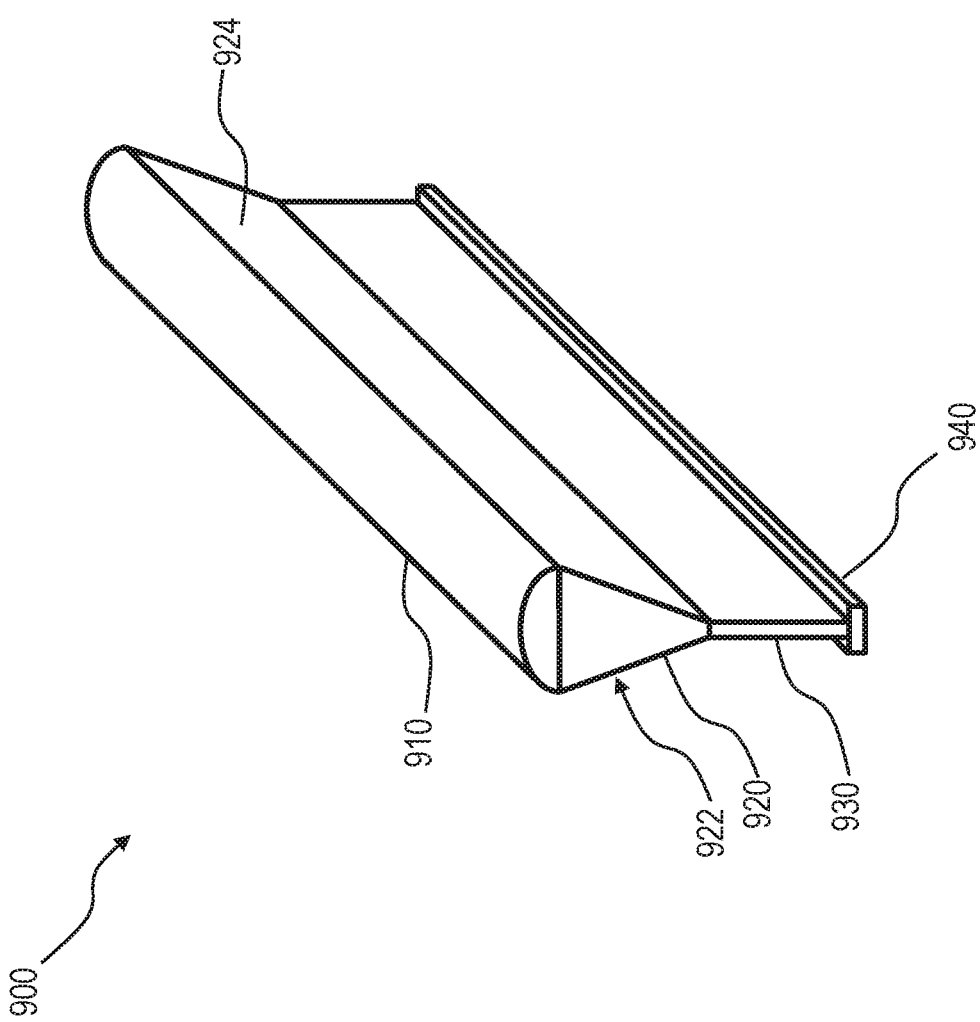
FIG. 9 illustrates a cylindrical concentrator, in accordance with various embodiments.

Referring to FIG. 9, a cylindrical concentrator 900 is illustrated according to various embodiments. The cylindrical concentrator 900 may comprise a dome 910, a cone 920, and a light pipe 930. The dome 910 may collect DNI light and direct the light into the cone 920, which in turn directs the light to a row of multi junction cells 940. The cone 920 may comprise a first planar side 922 and a second planar side 924 converging at the light pipe 930. The light pipe 930 may comprise a sheet of glass extending the length of the cylindrical concentrator 900. By using a cylindrical lens, the angle of acceptance is increased, so that the solar tracking requirement is reduced in one direction. The shape of the dome 910, the cone 920, and the light pipe 930 may be freeform optical surfaces.

The cylindrical concentrator 900 may be manufactured using a molding and drawing process. The dome 910, cone 920, and a slab planar light pipe 930 may be manufactured by molding. In various embodiments, the dome 910 and cone 920 may be molded as a single integral component. The pieces may be pressed together at high temperature so that part of the cone 920 and light pipe 930 is melted. The two pieces are then pulled, leading to the final structure where the top cylindrical lens is connected to the bottom slab light pipe by a planar sheet, which serves as a connecting light pipe. Alternatively, this embodiment can be fabricated using glass and plastic extrusion techniques.

Figure 10:
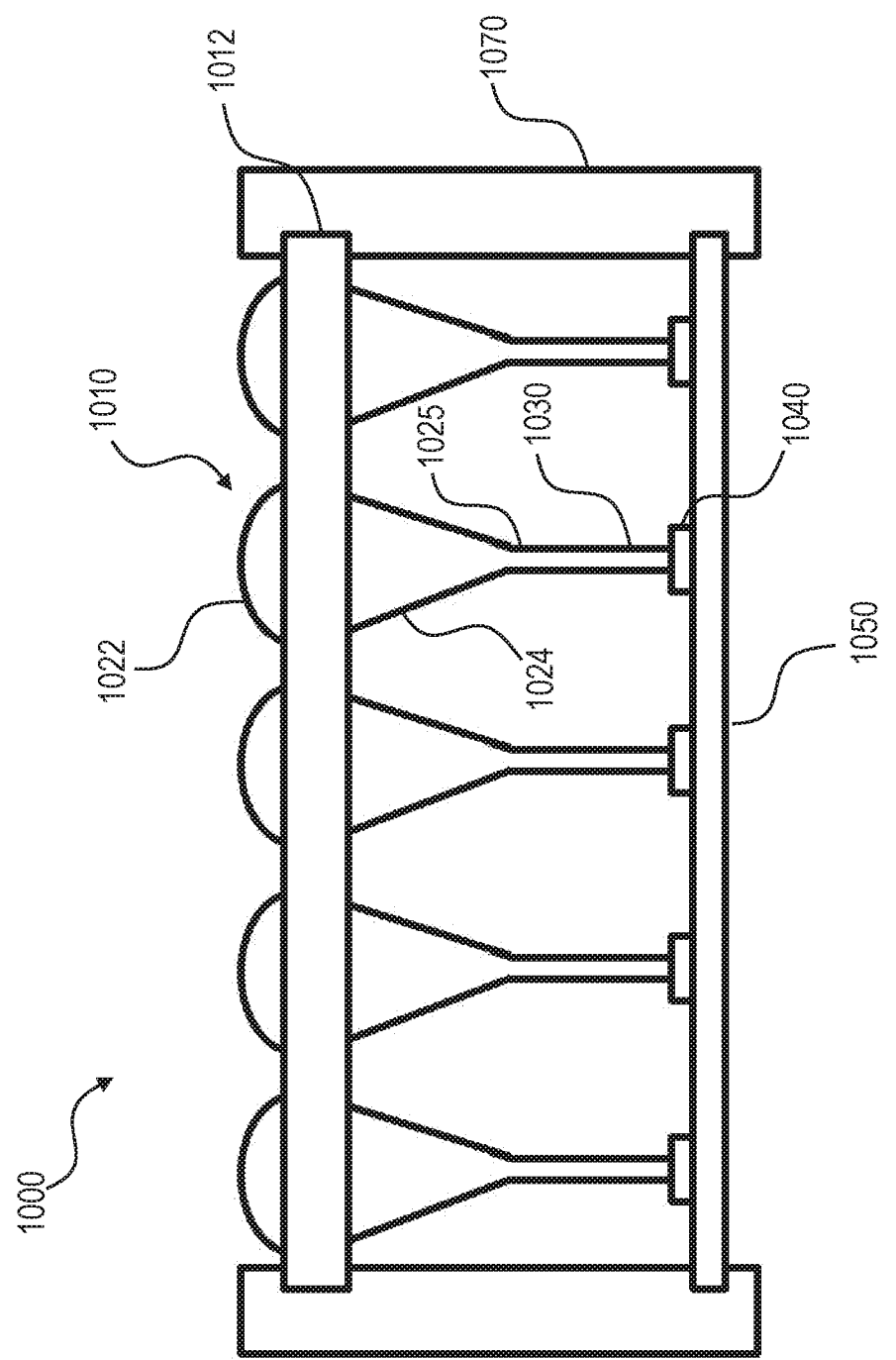
FIG. 10 illustrates a cross-section view of a PV module comprising a plurality of cylindrical lenses, in accordance with various embodiments.

Referring to FIG. 10, a cross-section view of a PV module 1000 comprising a plurality of cylindrical lenses 1010 is illustrated according to various embodiments. The PV module 1000 may comprise module walls 1070. The module walls 1070 may be coupled to the array substrate 1012. The array substrate 1012 may support the lenses 1010. Each lens 1010 may comprise a dome 1022 which protrudes above the array substrate 1012, and a cone 1024 which extends below the array substrate 1012. The cone 1024 may transition into the light pipe 1030 at the apex 1025 of the cone 1024. The dome 1022 may collect incident light and concentrate the light through the cone 1024 into the light pipe 1030. The light pipe 1030 may direct the light onto a row of multi junction cells 1040. Diffuse light passing through the lenses 1010 or through the array substrate 1012 may be collected by the silicon cell 1050. The module walls 1070 may be coupled to the silicon cell 1050 or a heat sink coupled to the silicon cell 1050.

Figure 11:
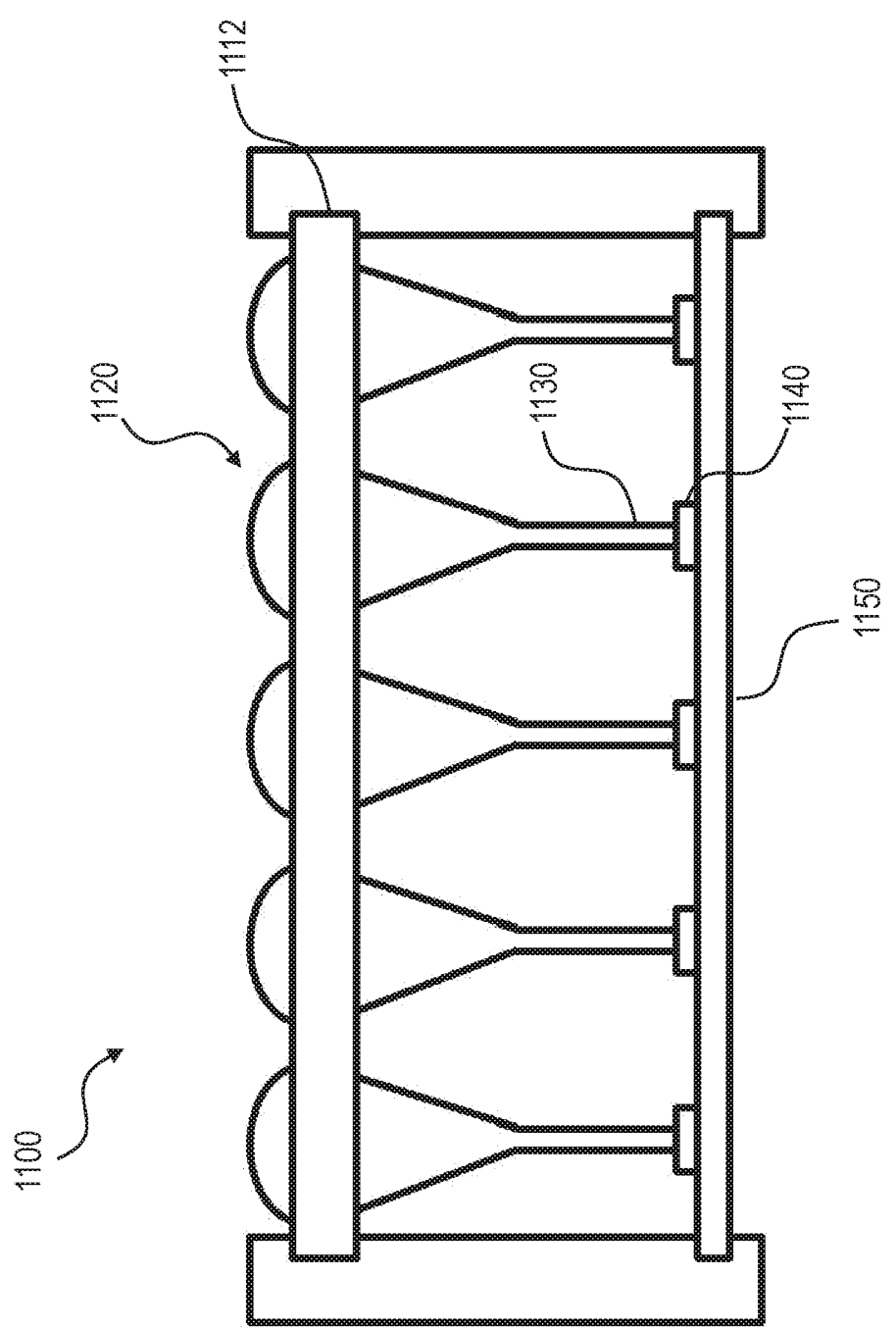
FIG. 11 illustrates a cross-section view of a micro-optic illuminator, in accordance with various embodiments.

Referring to FIG. 11, a cross-section view of a micro-optic illuminator 1100 is illustrated according to various embodiments. The lenses 1120, light pipes 1130, and array substrate 1112 may be similar or identical to those described with reference to FIGS. 1-10. The micro-optic illuminator may be tiled in a one dimensional array or in a two dimensional array. In a one dimensional array, the lenses 1120 may by cylindrical. In a two dimensional array, the lenses 1120 may be circular. The array may be periodic or aperiodic. The pitch of the array may be between 1 to 10 mm. The diameter of the light pipes 1130 may be between 0.1 to 1 mm. The thickness of the micro-optic illuminator 1100 may be between 10-100 mm. The shape of the micro-optics may be different from one adjacent element to another.

The function of each lens 1120 within the micro-optic illuminator 1130 depends on the ray direction. In various embodiments, light rays are incident to the lenses 1120. Light is collected, concentrated and directed to an optical device 1140. By putting an anti-reflection coating on the lenses 1120 and light pipes 1130, a power transmission of higher than 95% can be achieved over the operating wavelength range. The shape and area of the lenses 1120 and light pipes 1130 determines the light concentration ratio, which can range from 100s to 1000s. In such a configuration, the optical device 1140 can be a photosensor, p-n junction, charge-coupled device, or photovoltaic cell. The application can be planar photovoltaic module, large area imaging, and metrology.

In various embodiments, light rays are emitting out of the lenses 1120. The light distribution and direction depend on the shape of the freeform optics and can be designed based on different applications. The light source can be the optical device 1140 which may comprise a light emitting diode (LED) or a semiconductor laser diode (LD). The application can be a large area illumination panel or a digital display.

In various embodiments, light rays can be both collected and emitted from the micro-optic illuminator 1100. The optical devices 1140 may be both a light source and a light detector. In various embodiments, some optical devices 1140 act as light sources and others act as light detectors. However, in various embodiments each optical device 1140 may comprise a light source and a light detector. The application may be a large area user interface device or touch sensor. Another application may be an illumination source that changes based on the amount of ambient light. For example, the illumination source may turn on at night, where there is little ambient light, or change color temperature, depending on the light output of the array.

The optical devices 1140 may be placed on a substrate 1150, such as a circuit board, with electronic interconnects and circuits to provide power, process signals and control the optical devices 1140.

The cost for the optical devices 1140 may generally be proportional to the area of the optical devices 1140. The cost of the micro-optics is generally lower than that of the optical devices 1140. By reducing the required area of the optical devices 1140, it is possible to reduce the overall cost of the system. For example, by using a set of LEDs of micro- or milli-meters dimension and the micro-optics array, it is possible to construct a flat illumination source with less cost.

In this case, the amount of optical devices 1140 is reduced by the light concentration ratio of the micro-optics. Additionally, the spatial separation of the optical devices 1140 may reduce the thermal load and increases the operating lifetime of each optical device 1140. Using the example of an LED illumination source, the micro-optic illuminator 1100 may lead to a more stable color and intensity emission over the operating lifetime.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

We claim:

1. A photovoltaic module comprising:
   a plurality of module walls;
   a silicon cell coupled to the module walls;
   a multi junction cell coupled to the silicon cell;
   a printed circuit board coupled to the silicon cell;
   a convex lens embedded in a planar substrate, wherein the convex lens is configured to direct light to the multi junction cell, and wherein the planar substrate is configured to direct diffuse light to the silicon cell;
   a cone coupled to the convex lens;
   a light pipe of constant diameter coupled to the cone; and
   a gel coupling the light pipe to the multi junction cell,
   wherein an interior of the photovoltaic module is hermetically sealed.

2. The photovoltaic module of claim 1, wherein the light pipe is cylindrical.

3. The photovoltaic module of claim 2, wherein the light pipe is coupled to the multi-junction cell via a gel.

4. The photovoltaic module of claim 2, wherein the light pipe, the cone, the convex lens, and the planar substrate are a single integral component.

5. The photovoltaic module of claim 1, wherein the convex lens is circular.

6. The photovoltaic module of claim 1, wherein the convex lens is cylindrical.

7. The photovoltaic module of claim 1, wherein a shape of the convex lens is a freeform optical surface.

* * * * *